United States Patent
Wang et al.

(10) Patent No.: US 11,177,458 B2
(45) Date of Patent: Nov. 16, 2021

(54) DISPLAY DEVICE HAVING SHOCK ABSORBING LAYER

(71) Applicant: Samsung Display Co., LTD., Yongin-si (KR)

(72) Inventors: Ji Young Wang, Hwaseong-si (KR); Sung Woo Eo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/799,000

(22) Filed: Feb. 24, 2020

(65) Prior Publication Data
US 2021/0050552 A1    Feb. 18, 2021

(30) Foreign Application Priority Data
Aug. 12, 2019  (KR) .................. 10-2019-0098359

(51) Int. Cl.
| | | |
|---|---|---|
| *H01L 51/00* | (2006.01) | |
| *H01L 51/52* | (2006.01) | |
| *H01L 27/32* | (2006.01) | |
| *G02F 1/13* | (2006.01) | |
| *G02F 1/1335* | (2006.01) | |
| *G02F 1/1333* | (2006.01) | |
| *G02F 1/1362* | (2006.01) | |

(52) U.S. Cl.
CPC ...... *H01L 51/5253* (2013.01); *H01L 27/3244* (2013.01); *H01L 51/0097* (2013.01); *H01L 51/524* (2013.01); *G02F 1/133331* (2021.01); *G02F 1/133512* (2013.01); *G02F 1/136209* (2013.01); *H01L 2251/5338* (2013.01)

(58) Field of Classification Search
CPC ............ H01L 51/5253; H01L 51/0097; H01L 51/524; H01L 27/3244; H01L 2251/5338; G02F 1/136209; G02F 1/133512; G02F 1/133331
See application file for complete search history.

(56) References Cited

U.S. PATENT DOCUMENTS 7,355,341 B2 * 4/2008 Yoshizawa .......... H01L 51/5256
313/506
7,924,392 B2 * 4/2011 Yamazaki ........... G02F 1/13454
349/153
(Continued)

FOREIGN PATENT DOCUMENTS

| KR | 1020180008204 A | 1/2018 |
|---|---|---|
| KR | 1020180034056 A | 4/2018 |

(Continued)

*Primary Examiner* — Ida M Soward
(74) *Attorney, Agent, or Firm* — Cantor Colburn LLP

(57) ABSTRACT

A display device includes a display panel; a cover window facing the display panel; a functional layer between the display panel and the cover window; a shock-absorbing layer between the cover window and the functional layer; a first coupling interlayer which is between the shock-absorbing layer and the functional layer and couples the shock-absorbing layer and the functional layer to each other; and a second coupling interlayer which is between the shock-absorbing layer and the cover window and couples the shock-absorbing layer and the cover window to each other. A thickness of the first coupling interlayer and the second coupling interlayer ranges from about 20 micrometers to about 50 micrometers.

20 Claims, 15 Drawing Sheets

(56) References Cited

U.S. PATENT DOCUMENTS

| | | | | |
|---|---|---|---|---|
| 7,969,539 | B2* | 6/2011 | Sakurai | G02F 1/133308 349/110 |
| 10,509,439 | B2* | 12/2019 | Choi | G06F 1/1652 |
| 10,627,866 | B2* | 4/2020 | Hiroki | G06F 1/1652 |
| 10,673,012 | B2* | 6/2020 | Kim | B32B 27/281 |
| 10,935,826 | B2* | 3/2021 | Ogawa | C08F 222/1006 |
| 2002/0159016 | A1* | 10/2002 | Nishida | G02F 1/134363 349/141 |
| 2014/0192416 | A1* | 7/2014 | Wang | G02B 27/0018 359/609 |
| 2014/0240926 | A1* | 8/2014 | Choi | H04M 1/0266 361/707 |
| 2019/0064615 | A1* | 2/2019 | Lim | G02F 1/136204 |
| 2020/0411790 | A1* | 12/2020 | Wen | H01L 21/683 |

FOREIGN PATENT DOCUMENTS

| | | |
|---|---|---|
| KR | 1020180074544 A | 7/2018 |
| KR | 1020180097195 A | 8/2018 |

\* cited by examiner

FIG. 5

| RELIABILITY ITEMS | SIGNIFICANT PERFORMANCE FOR EACH STRUCTURE | | |
|---|---|---|---|
| | COMPARATIVE EXAMPLE | FIRST EMBODIMENT | SECOND EMBODIMENT |
| ROOM-TEMPERATURE (LOW TEMPERATURE) REPULSIVE FORCE (N-cm) | 7.7 (11.0) | 8.1 (12.9) | 6.3 (9.5) |
| POL Crack (%) | 1.26 | 1.34 | 1.23 |
| UTG Crack (MPa) | 796 | 783 | 782 |
| Crease ($\mu$m) | 19 | 7.5 | 7.8 |

FIG. 6

| RELIABILITY ITEMS | | SIGNIFICANT PERFORMANCE FOR EACH STRUCTURE | | |
|---|---|---|---|---|
| | | COMPARATIVE EXAMPLE | FIRST EMBODIMENT | SECOND EMBODIMENT |
| IMPACT RESISTANCE | Ball (cm) | 5 | 8 | 6 |
| | Pen (cm) | 3 | 8 | 5 |
| ARTIFICIAL FINGER NAIL (gf) | | 1000 | 1900 | 1800 |

DISPLAY DEVICE HAVING SHOCK ABSORBING LAYER

This application claims priority to Korean Patent Application No. 10-2019-0098359 filed on Aug. 12, 2019, and all the benefits accruing therefrom under 35 U.S.C. § 119, the disclosure of which is incorporated herein by reference in its entirety.

BACKGROUND

1. Field

The invention relates to a display device, and more particularly, to a display device capable of being folded and unfolded.

2. Description of the Related Art

Display devices are apparatuses which display an image and each include a display panel such as an organic light-emitting display panel and a liquid crystal panel.

A mobile electronic device includes a display device to provide a user with an image. Mobile electronic devices having a relatively larger display screen in addition to a thickness equal to or smaller than conventional electronic devices have increased in use. Foldable or bendable display devices, having a structure which is foldable and unfoldable, to provide a relatively larger screen only while the display devices are in use, have been developed.

SUMMARY

One or more embodiment of the invention provides a display device with improved strength against an external impact.

It should be noted that objects of the present disclosure are not limited to the above-described objects, and other objects of the present disclosure will be apparent to those skilled in the art from the following descriptions.

According to an embodiment, a display device includes a display panel; a cover window facing the display panel; a functional layer between the display panel and the cover window; a shock-absorbing layer between the cover window and the functional layer; a first coupling interlayer which is between the shock-absorbing layer and the functional layer and couples the shock-absorbing layer and the functional layer to each other; and a second coupling interlayer which is between the shock-absorbing layer and the cover window and couples the shock-absorbing layer and the cover window to each other. A thickness of the first coupling interlayer and the second coupling interlayer ranges from about 20 micrometers (μm) to about 50 μm.

The shock-absorbing layer may include a transparent material.

The shock-absorbing layer may include a transparent organic insulating material.

The organic insulating material may include polyimide or polyethylene terephthalate.

The functional layer may include a polarization layer.

A side surface of the shock-absorbing layer and a side surface of the functional layer may be aligned with each other along a thickness direction.

A thickness of the cover window may range from about 30 μm to about 50 μm.

The display device may include a display area including a pixel, a non-display area adjacent to the display area, and a light-barrier pattern in the non-display area. The light-barrier pattern may be between the shock-absorbing layer and the second coupling interlayer.

The second coupling interlayer may include a first portion overlapping the light-barrier pattern and a second portion adjacent to the first portion, and a thickness of the first portion may be smaller than a thickness of the second portion.

The display device may include a display area including a pixel, a non-display area adjacent to the display area, and a light-barrier pattern in the non-display area. The light-barrier pattern may be disposed between the shock-absorbing layer and the first coupling interlayer.

The first coupling interlayer may include a first portion overlapping the light-barrier pattern and a second portion adjacent to the first portion, and a thickness of the first portion may be smaller than a thickness of the second portion.

The display device may further include a buffering layer facing the display panel, and a support film between the buffering layer and the display panel.

The display device may include a folding region at which the display device is foldable, and a non-folded region at opposing sides of the folding region. Here, the buffering layer may be in the folding region and the non-folded region, and in the folding region, the buffering layer may be indented along a thickness direction.

The display device may further include a metal plate facing the support film with the buffering layer therebetween. Here, the non-folded region may include a first non-folded region and a second non-folded region opposing each other with the folding region therebetween, the metal plate may include a first metal plate corresponding to the first non-folded region and a second metal plate corresponding to the second non-folded region, and the first metal plate and the second metal plate may be spaced apart from each other with the folding region therebetween.

The display device may further include a light-barrier layer between the shock-absorbing layer and the first coupling interlayer. Here, the light-barrier layer may block light in an ultraviolet wavelength range.

The display device may further include a light-barrier layer between the shock-absorbing layer and the second coupling interlayer. Here, the light-barrier layer may lock light in an ultraviolet wavelength range.

The shock-absorbing layer may further include a light-barrier material, and the light-barrier material may block light in an ultraviolet wavelength range.

According to another embodiment, a display device includes a display area including a pixel; a non-display area adjacent to the display area; a display panel; a cover window facing the display panel; a functional layer between the display panel and the cover window; a shock-absorbing layer between the cover window and the functional layer; a first coupling interlayer which is between the shock-absorbing layer and the functional layer and couples the shock-absorbing layer and the functional layer to each other; a second coupling interlayer which is between the shock-absorbing layer and the cover window and couples the shock-absorbing layer and the cover window to each other; and a light-barrier pattern in the non-display area, the light-barrier pattern extended from a surface of the shock-absorbing layer.

The surface of the shock-absorbing layer may face the functional layer.

The surface of the shock-absorbing layer may face the cover window.

Details of other examples are included in the detailed description and drawings.

BRIEF DESCRIPTION OF THE DRAWINGS

The above and other features of the present disclosure will become more apparent by describing exemplary embodiments thereof in detail with reference to the attached drawings, in which:

FIGS. 5 and 6 are tables showing reliability of a comparative example and embodiments of a display device;

DETAILED DESCRIPTION

Figure 1:
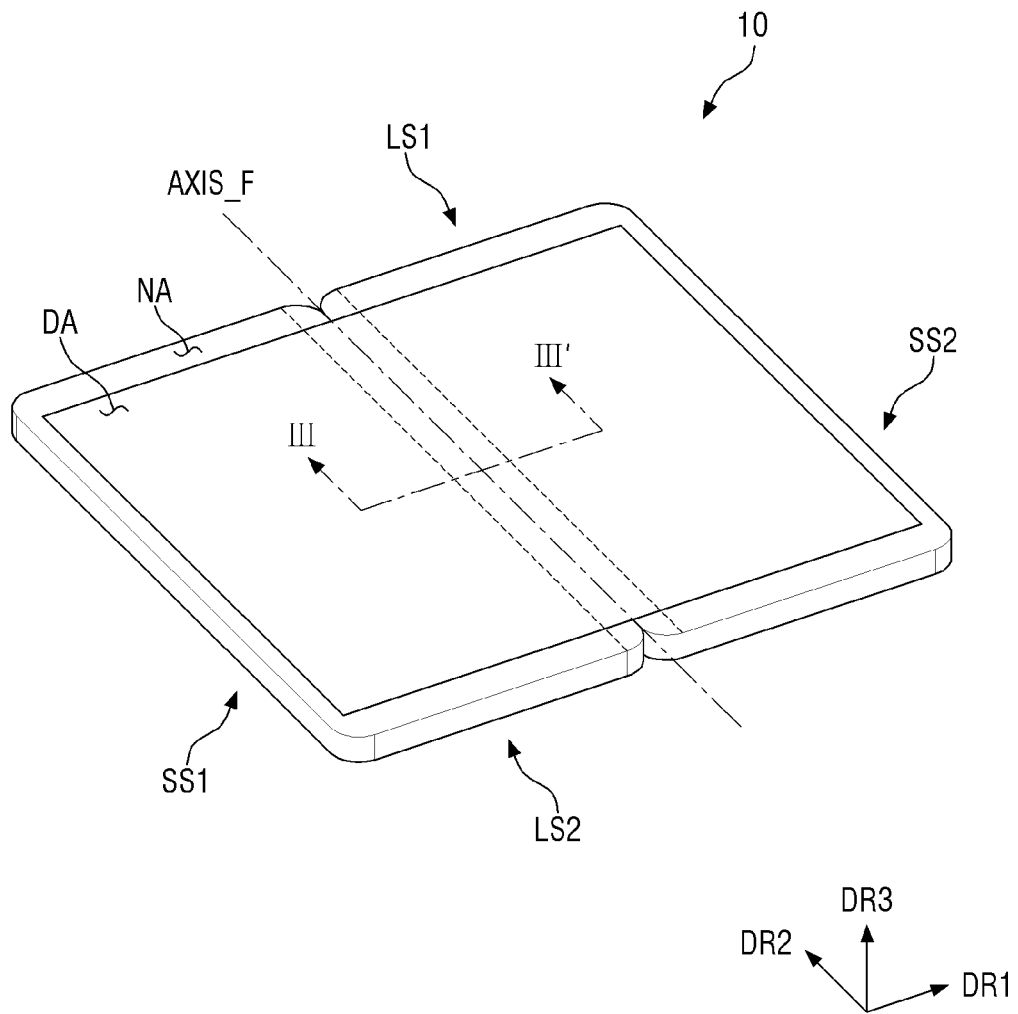
FIG. 1 is a perspective view of an embodiment of a display device.

Advantages and features of the present disclosure and a method of achieving the same will become apparent with reference to the attached drawings and embodiments described below in detail. However, the present disclosure is not limited to the embodiments described below and may be embodied with a variety of different modifications. The embodiments are merely provided to allow one of ordinary skill in the art to completely understand the scope of the present disclosure, and the present disclosure is defined only by the scope of the claims.

When it is stated that an element or a layer is related to another element such as being "on" another element or layer, the element may not only be directly on another element or layer but another layer or element may be interposed therebetween. In contrast, when it is stated that an element or a layer is related to another element such as being "directly on" another element or layer, no other element or layer is interposed therebetween. Throughout the specification, like reference numerals refer to like elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display device is an electronic device which displays a moving picture or a still image. The display device may be used as or define a display screen of a variety of portable electronic devices such as a mobile phone, a smart phone, a tablet personal computer ("PC"), a smart watch, a watch phone, a mobile communication terminal, an electronic notebook, an electronic book, a portable multimedia player ("PMP"), a navigation system, an ultra-mobile PC, and the like but also display devices such as a television, a laptop PC, a monitor, an advertising panel, an Internet of Things (IoT) device, and the like.

Hereinafter, embodiments will be described with reference to the attached drawings.

FIG. 1 is a perspective view of an embodiment of a display device 10.

Referring to FIG. 1, a display device 10 may be a foldable display. Throughout the specification, the term "foldable" may refer to a flexible state, and in more detail, includes "bendable," "rollable," and the like. In addition, it is necessary to understand the term "foldable" as being capable of referring to all of "partially foldable," "entirely foldable," "in-foldable," and "out-foldable."

The display device 10 may include a folding axis AXIS_F which traverses the display device 10 from a position above the display device 10 to a position below the display device 10, in a plan view. The display device 10 is foldable about or with respect to the folding axis AXIS_F. Components, layers, elements, features, etc. of the display device 10 may also be foldable about the folding axis AXIS_F, without being limited thereto.

The display device 10 may have a substantially rectangular shape in a plan view. The display device 10 may have a rectangular shape with rounded corners or corners defined by linear portion which meet each other, in the plan view. Referring to FIG. 1, the display device 10 may be disposed flat or substantially in a plane defined by a first direction DR1 and a second direction DR2 which cross each other. A third direction DR3 may cross each of the first direction DR1 and the second direction DR2. A thickness of the display device 10 and/or components, layers, elements, features, etc. of the display device 10, may be defined along the third direction DR3 (e.g., a thickness direction DR3).

The display device 10 may include or define four edges LS1, LS2, SS1, and SS2. The display device 10 may include long-side edges LS1 and LS2 and short-side edges SS1 and SS2. The long-side edges LS1 and LS2 and the short-side edges SS1 and SS2 may otherwise be referred to as edges LS1, LS2, SS1, and SS2 or outer edges LS1, LS2, SS1, and SS2. Referring again to FIG. 1, for example, the long-side edges LS1 and LS2 may extend along a first direction DR1 and the short-side edges SS1 and SS2 may extend along a second direction DR2. A total length of the edge LS1 and/or edge LS2 along the first direction DR1, may be relatively larger than each total length among the edge SS1 and the edge SS2 along the second direction DR2.

As shown in FIG. 1, the folding axis AXIS_F may extend along a direction which traverses the long-side edges LS1 and LS2, for example, extend along the second direction DR2. In this case, the long-side edges LS1 and LS2 of the display device 10 are foldable about the folding axis AXIS_F. Unlike that shown in FIG. 1, the folding axis AXIS_F may extend along a direction which traverses the short-side edges SS1 and SS2 for example, extend along the first direction DR1. In this case, the short-side edges SS1 and SS2 of the display device 10 are foldable about the folding axis AXIS_F. Hereinafter, for convenience of description, a case in which the folding axis AXIS_F extends to traverse the long-side edges LS1 and LS2 will be described mainly. The folding axis AXIS_F may be defined to traverse central portions of the long-side edges LS1 and LS2 but the present disclosure is not limited thereto.

Throughout the specification, on the basis of a thickness direction, "top" and "top surface" refer to a display direction, a light-emitting direction, etc. and "bottom" and "bottom surface" refer to a direction opposite the display direction, the light-emitting direction, etc. unless defined otherwise. Also, it should be understood that in a plan view, "above," "below," "left," and "right" indicate directions along a plane defined by two directions crossing each other. In a plan view may also indicate the display device 10 for which a display surface is disposed in position, such as to display an image, emit light for displaying an image, etc.

The display device 10 may include a display area DA and a non-display area NA which is adjacent to the display area DA, such as on a periphery of the display area DA (e.g., closer to an outer edge of the display device 10 than the display area DA). The display area DA is an area which may define a display screen and a planar area at which an image is displayed. The non-display area NA is an area (e.g., a planar area) at which an image is not displayed.

The display area DA may be located in a central portion of the display device 10. Referring to FIG. 1, for example, the display device 10 which is unfolded disposes the display area DA at a central portion of the display device 10. The display device 10 which is folded, divides the display area DA into divided areas with respect to the folding axis AXIS_F. The display device 10 which is folded disposes the divided areas overlapped with each other along a thickness direction. The display device 10 which is unfolded disposes the divided areas adjacent to each other, such as to form a display screen at which an image is displayed in the display area DA.

In an embodiment, at areas adjacent to a first long-side edge LS1 and a second long-side edge LS2 of the display device 10 which meet the folding axis AXIS_F, grooves (for example, notches) which are recessed upward and/or downward to be concave (e.g., concave parts, not shown) are provided or formed in a plane, and a hinge member (not shown) with which the display device 10 may be folded or unfolded, may be coupled with the concave parts, but the present disclosure is not limited thereto.

Figure 3:
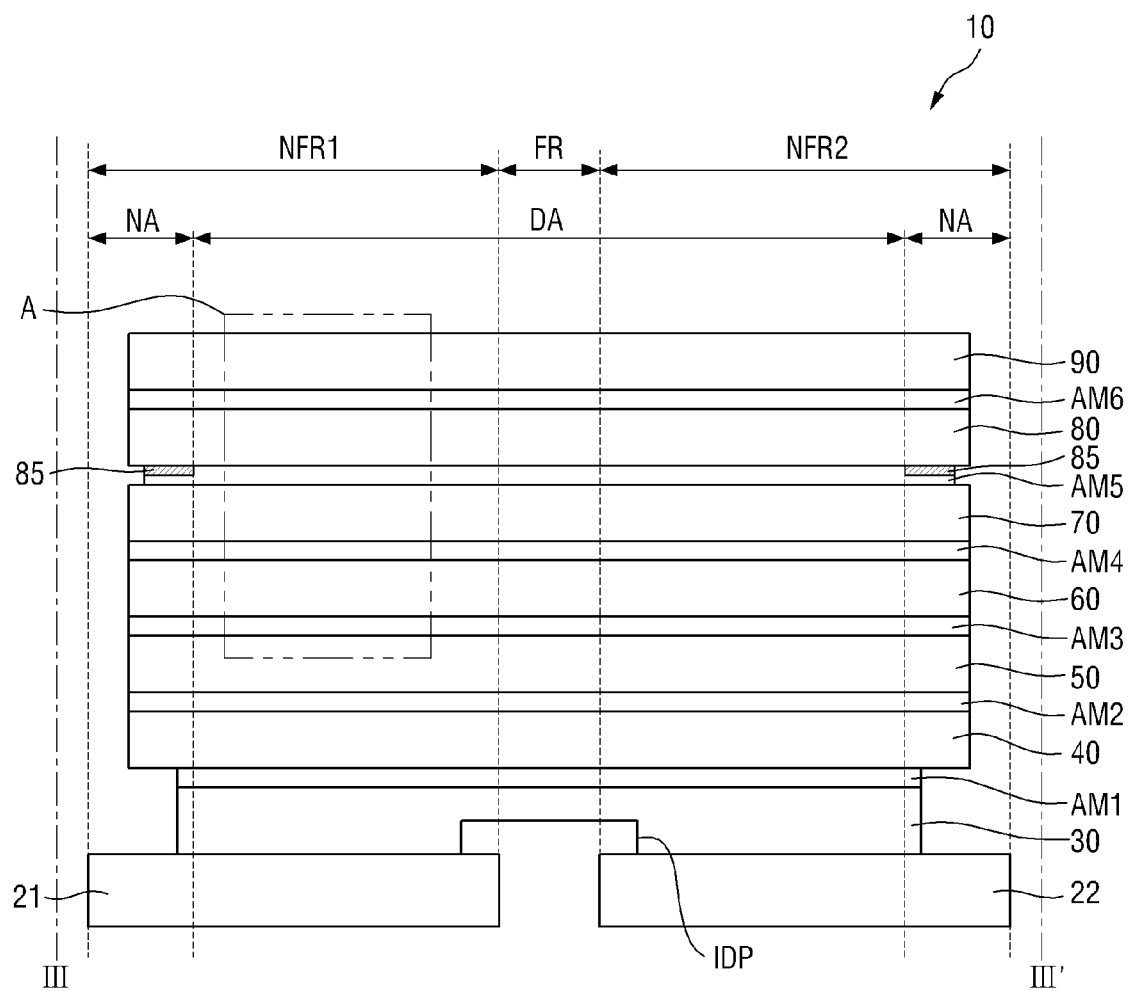
FIG. 3 is a cross-sectional view taken along line of FIG. 1.

Referring to FIG. 1 and FIG. 3, the display device 10 may be divided into a folded region FR (e.g., foldable region FR or folding region FR) at which the display device 10 is foldable, and non-folded regions NFR1 and NFR2 (e.g., first flat region NFR1 and second flat region NFR2) on the basis of the folding axis AXIS_F.

That is, the display device 10 may include the folded region FR which is disposed in a central area of the display device 10 and includes the folding axis AXIS_F, and non-folded regions NFR1 and NFR2 spaced apart from each other with the folded region FR being interposed between. A first non-folded region NFR1 may be located at a first side of the folded region FR along the first direction DR1, and a second non-folded region NFR2 may be located at a second side of the folded region FR along the first direction DR1, the second side being opposite to the first side.

The folded region FR may be a region in which the display device 10 is foldable or bendable with a certain curvature along a folding direction. The non-folded regions NFR1 and NFR2 may be regions at which the display device is not foldable, unlike the folded region FR. The non-folded regions NFR1 and NFR2 may be flat to define flat surfaces. The flat surfaces may be in a same plane (e.g., coplanar) but the present disclosure is not limited thereto such that the surfaces defined by the non-folded regions NFR1 and NFR2 may be partially bent or curved. In an embodiment, referring to FIGS. 1 and 3, the display device 10 which is unfolded disposes surfaces defined by the non-folded regions NFR1 and NFR2 coplanar with each other. The coplanar surfaces defined by the non-folded regions NFR1 and NFR2 may form a display screen, a display surface, an outermost surface, etc. of the display device 10.

Figure 2:
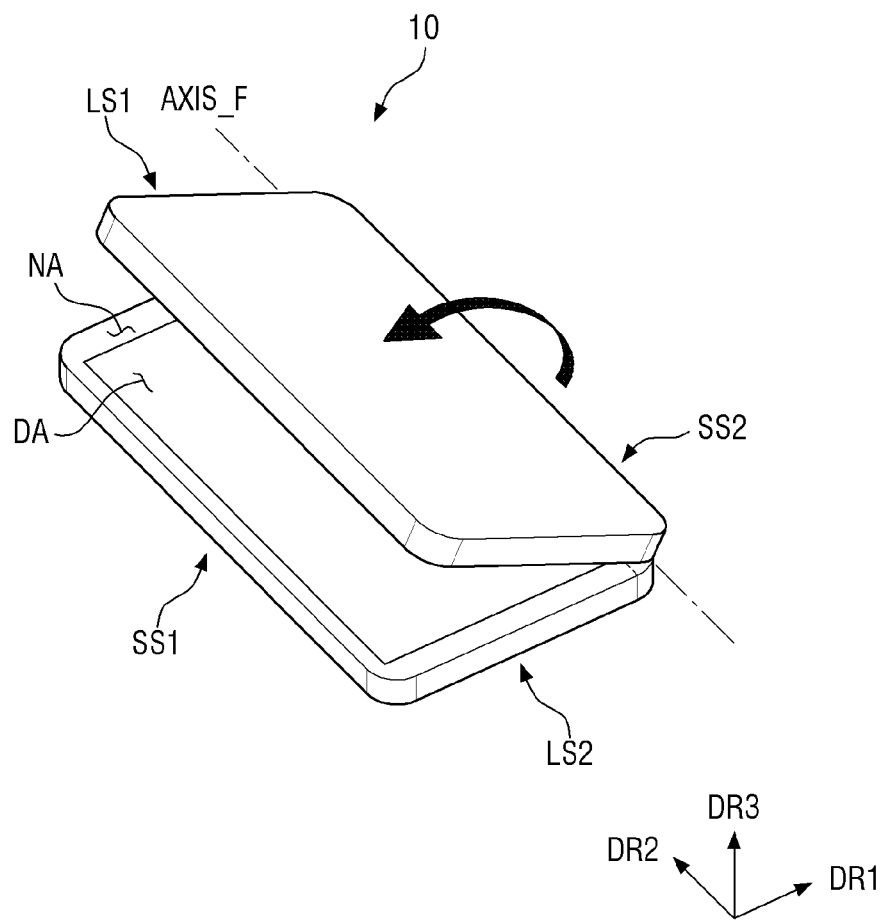
FIG. 2 is a perspective view illustrating the display device which is folded.

FIG. 2 is a perspective view illustrating the display device 10 which is folded. The display device 10 in FIG. 2 may be the display device 10 of FIG. 1 which is folded.

Referring to FIG. 2, the display device 10 is folded with a certain curvature in the folded region FR, such as by an external force, and may not be substantially folded in the non-folded regions NFR1 and NFR2 by such an external force. That is, the display device 10 may have flat surfaces in the non-folded regions NFR1 and NFR2, which form a single surface or plane (e.g., are coplanar with each other).

When an external force is applied to one side of the display device 10, for example, to a right side of the display device 10 along a folding direction (e.g., arrow in FIG. 2 including the upward direction in FIG. 3), the folded region FR may be curved or folded. The folding region FR which is curved or folded while moving or rotating along the folding direction, disposes the second non-folded region NFR2 overlapped with or facing the first non-folded region NFR1.

In FIG. 2, the display device 10 is in-folded. In-folding of the display device 10 may refer to the display device 10 being folded such that both sides of an uppermost surface of the display device 10 which oppose each other relative to the folding axis AXIS_F (e.g., a top surfaces of a protection layer 90, refer to FIG. 3) face each other.

In some embodiments, the display device 10 may be out-folded. Out-folding of the display device 10 may refer to the display device 10 being folded such that both sides of the uppermost surface of the display device 10 which oppose each other relative to the folding axis AXIS_F (e.g., the top surface of the protection layer 90, refer to FIG. 3) face away from each other.

Figure 4:
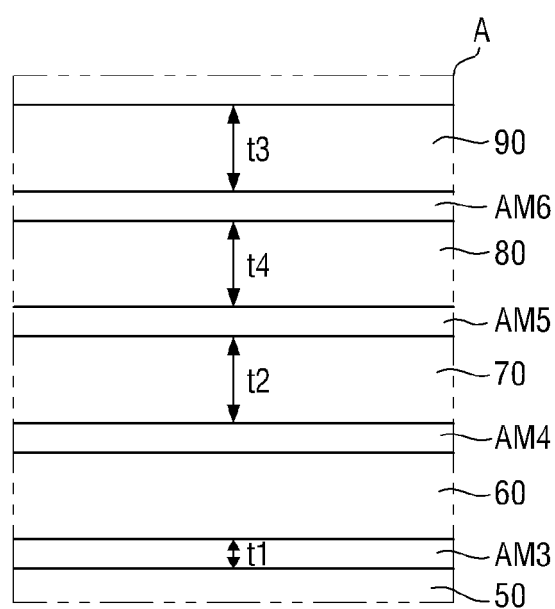
FIG. 4 is an enlarged cross-sectional view illustrating area A of FIG. 3.

FIG. 3 is a cross-sectional view taken along line of FIG. 1, and FIG. 4 is an enlarged cross-sectional view illustrating area A of FIG. 3.

Referring to FIGS. 3 and 4, the display device 10 may include relatively rigid plates 21 and 22 (e.g., metal plates 21 and 22), a buffering layer 30 (hereinafter, buffering member 30), a support layer 40, a display panel 50, a functional layer (hereinafter, an upper functional member 60), a shock-absorbing layer 70, a cover window 80, and the protection layer 90. The display device 10 may further include coupling members AM1, AM2, AM3, AM4, AM5 and AM6 which are respectively disposed between the above components and couple adjacent components with each other. The coupling members AM1, AM2, AM3, AM4, AM5 and AM6 may also be referred to as coupling interlayers AM1, AM2, AM3, AM4, AM5 and AM6. The aforementioned components may include one or more of a display area DA, a non-display area NA, a folded region FR, a first non-folded region NFR1, a second non-folded region NFR2, etc., which respectively corresponds to the display area DA, the non-display area NA, the folded region FR, the first non-folded region NFR1, the second non-folded region NFR2, etc. which are described above for the display device 10.

The display panel 50 may display an image according to an electrical signal such as an input data signal. As the display panel 50, an organic light-emitting display panel, a liquid crystal display panel, a plasma display panel, an electrophoretic display panel, an electrowetting display panel, a quantum-dot light-emitting display panel, a micro light emitting diode ("LED") display panel, and the like may be applied. In the exemplified embodiment, an organic light-emitting display panel is applied as the display panel 50.

The display panel 50 may include a flexible substrate including a flexible polymer material such as polyimide ("PI") and the like. Accordingly, the display panel 50 may be curvable, bendable, foldable, or rollable. The display panel 50 may generally have a planar shape which is similar to a planar shape of the display device 10.

The display panel 50 may include a pixel PX may be provided in plurality (e.g., plurality of pixels PX) arranged in the display area DA of the display panel 50. A signal line may be provided in plurality (e.g., signal lines) and/or a driving circuit may be provided in plurality (e.g., driving circuits) in the non-display area NA, for applying one or more electrical signal to each of the pixels PX in the display area DA. One or more of the signal lines and/or driving circuits may be connected to the pixels PX for applying one or more electrical signal to each of the pixels PX. The display panel 50 may further include a black matrix in the non-display area NA. The black matrix may have a quadrangular frame shape in a plan view.

The pixel PX may include a light-emitting layer and a circuit layer which is connected to the light-emitting layer and controls a light-emitting quantity of the light-emitting layer. The circuit layer may include a plurality of wires, a plurality of electrodes, and at least one transistor. In one embodiment, the light-emitting layer may include an organic light-emitting material. The light-emitting layer may be sealed by an encapsulation film. The encapsulation film may reduce or effectively prevent humidity and the like from flowing into the pixel PX from the outside thereof by sealing the light-emitting layer. The encapsulation film may include a single-layer or multilayer inorganic film, or a lamination film provided or formed by alternately laminating an inorganic film including an inorganic material and an organic film including an organic material.

The support layer 40 may be disposed below the display panel 50. The support layer 40 may be disposed in the folded region FR and the non-folded regions NFR1 and NFR2 of the display device 10. The support layer 40 may include, for example, a polymer organic insulating material such as PI and the like. A second coupling member AM2 disposed on a surface of the support layer 40 which faces the display panel 50, a first coupling member AM1 disposed on a surface of the support layer 40 which faces the buffering member 30, and the support layer 40 may together form a support film.

The support film or the support layer 40 is disposed below the display panel 50 and may perform a function of supporting the display panel 50.

The buffering member 30 may be disposed below the support layer 40. The buffering member 30 may reduce or effectively prevent a shock applied from outside thereof (for example, from below the buffering member 30) from being transferred to the display panel 50. The buffering member 30 may include or be formed of a foam material. The buffering member 30 may include, for example, polyurethane ("PU"), thermoplastic PU ("TPU"), silicon (Si), polydimethylacrylamide ("PDMA"), and the like.

The buffering layer 30 may be disposed in the folded region FR and the non-folded regions NFR1 and NFR2. The buffering member 30 may be indented toward the display panel 50 in the folded region FR, to define an indent at the folded region FR. That is, a thickness of the buffering member 30 at an indented portion IDP thereof may be smaller than a thickness of the buffering member 30 at which the indented portion IDP is not provided such as a remainder of the buffering member 30. The indented portion IDP of the buffering member 30 may be in the folded region FR and extend from the folded region FR to the non-folded regions NFR1 and NFR2 adjacent to the folded region FR.

The buffering member 30 further includes the indented portion IDP in the folded region FR such that a bending stress of the display device 10 may be relaxed in the folding of the display device 10.

In some embodiments, unlike that shown in FIG. 3, the indented portion IDP of the buffering member 30 may be disposed only in the folded region FR and not disposed in the non-folded regions NFR1 and NFR2. Referring to FIG. 3, outer edges of the buffering member 30 may be spaced apart from outer edges of other layers within the display device 10.

The metal plates 21 and 22 may be disposed below the buffering member 30. A first metal plate 21 may be disposed in the first non-folded region NFR1, and a second metal plate 22 may be disposed in the second non-folded region NFR2. The first metal plate 21 and the second metal plate 22 may be disposed to be spaced apart from each other with the folded region FR being interposed therebetween.

In FIG. 3, an inner surface of the first metal plate 21 is aligned with a border between the folded region FR and the first non-folded region NFR1 and an inner surface of the second metal plate 22 is aligned with a border between the folded region FR and the second non-folded region NFR2. However, the present disclosure is not limited thereto and the inner surface of the first metal plate 21 may be located further outside the border between the folded region FR and the first non-folded region NFR1 (e.g., on a side of the border closer to the outer edge of the display device 10) and the inner surface of the second metal plate 22 may be located further outside the border between the folded region FR and the second non-folded region NFR2.

In FIG. 3, the buffering member 30 and the first metal plate 21 and the buffering member 30 and the second metal plate 22 come into direct contact with each other without coupling members between the buffering member 30 and the metal plates 21 and 22, respectively. However, the present disclosure is not limited thereto and coupling members may be further disposed between the buffering member 30 and each of the metal plates 21 and 22, respectively, such that the buffering member 30, and each of the metal plates 21 and 22, may be coupled with each other by the coupling members. A material of the coupling members may be substantially equal to a material of the first coupling member AM1 which will be described below.

The upper functional member 60 may be further disposed above the display panel 50. The upper functional member 60 may include at least one functional layer. The functional layer may be a layer which performs a touch-sensing function, a color-filtering function, a color-converting function, a polarization function, an anti-reflection function, a bio-information recognition function (for example, a fingerprint recognition function), or the like. The functional layer may be a sheet layer provided as a sheet, a film layer provided as a film, a thin film layer, a coating layer, a panel, a plate, or the like. The upper functional member 60 may include one functional layer as a single layer but the present disclosure is not limited thereto and the upper functional member 60 may include a multilayer structure including different functional layers in a stacked or laminated structure.

The upper functional member 60 may include a polarization layer which performs the polarization function.

The shock-absorbing layer 70 may be disposed above the upper functional member 60.

The shock-absorbing layer 70 may include a transparent material. The shock-absorbing layer 70 includes the transparent material such that an exit rate of light exiting from the display panel 50 to outside thereof may be increased.

The transparent material may include a transparent organic insulating material. The transparent organic insulating material may include polyethylene terephthalate ("PET"), PI, or the like.

As described above, a thickness of the cover window 80 may be relatively small such that the cover window 80 offers relatively low durability to the display device 10 with respect to an external impact thereto. In one or more embodiment, the display device 10 may further include the shock-absorbing layer 70 so as to increase durability of the display device 10 with respect to the external impact.

The cover window 80 may be disposed above the shock-absorbing layer 70, such as relative to the display direction of the display device 10.

The cover window 80 covers and protects components or members disposed below. The cover window 80 may include glass, quartz, and the like. When the thickness of the cover window 80 is relatively small, a stress may decrease while the cover window 80 is folded, and a structural deformation degree may be inadequate even when a folded state and an unfolded state are repeated. The cover window 80 may include ultra-thin glass ("UTG").

The protection layer 90 may be disposed above the cover window 80. The protection layer 90 may be disposed above the cover window 80 and may perform a function of protecting lower components including the cover window 80 having a relatively small thickness from an external impact. The protection layer 90 may form an outermost surface of the display device 10, without being limited thereto.

The protection layer 90 may additionally perform a short-wave light L1 filtering function. A relatively short wave may include a wavelength range of about 10 nanometers (nm) to about 400 nm. The protection layer 90 may perform a function of reducing or effectively preventing transmission to outside the display device 10 of relatively short-wave light among light provided by the display panel 50. That is, the protection layer 90 may further include a material which performs the short-wave light L1 filtering function. The material which performs the short-wave light filtering function may absorb the short-wave light L1.

The first coupling member AM1 may be disposed between the buffering member 30 and the support layer 40 and may perform a function of coupling the buffering member 30 with the support layer 40. A second coupling member AM2 may be disposed between the support layer 40 and the display panel 50 and may perform a function of coupling the support layer 40 with the display panel 50. A third coupling member AM3 may be disposed between the display panel 50 and the upper functional member 60 and may perform a function of coupling the display panel 50 with the upper functional member 60. A fourth coupling member AM4 may be disposed between the upper functional member 60 and the shock-absorbing layer 70 and may perform a function of coupling the upper functional member 60 with the shock-absorbing layer 70. A fifth coupling member AM5 may be disposed between the shock-absorbing layer 70 and the cover window 80 and may perform a function of coupling the shock-absorbing layer 70 with the cover window 80. A sixth coupling member AM6 may be disposed between the cover window 80 and the protection layer 90 and may perform a function of coupling the cover window 80 with the protection layer 90.

The coupling members AM1 to AM6 are films having adhesive surfaces (e.g., adhesive top and bottom surfaces). The coupling members AM1 to AM6 may include, for example, one or more of pressure sensitive adhesives ("PSA"), optical clear adhesives ("OCA"), and optical clear resins ("OCR"). An adhesive film of the coupling members AM1 to AM6 may include an acrylic resin, a silicone resin, or the like. Also, the adhesive may have an elongation rate of about 100% to about 1,000%.

The metal plates 21 and 22, the buffering member 30, the support layer 40, the display panel 50, the upper functional member 60, the shock-absorbing layer 70, the cover window 80, and the protection layer 90 may be disposed in the display area DA and the non-display area NA. That is, these component layers may be common to each of the display area DA and the non-display area NA.

The display device 10 may further include a light-barrier pattern 85 disposed on one surface of the cover window 80 in the non-display area NA. The light-barrier pattern 85 may be a black matrix. The light-barrier pattern 85 may be disposed in the non-display area NA which is adjacent to the display area DA. The light-barrier pattern 85 may disposed in a continuous quadrangular frame shape in the non-display area NA to form an edge portion of the display device 10 which surrounds the display area DA in a plan view.

The light-barrier pattern 85 may be disposed directly on a first surface of the cover window 80 which faces the display panel 50. In some embodiments, the light-barrier pattern 85 may be disposed directly on a second surface of the cover window 80 which is opposite to the first surface thereof and faces the protection layer 90.

The light-barrier pattern 85 may include an opaque organic material or an opaque organic/inorganic material including a photo-sensitive material or an opaque inorganic material such as a metal and the like to reduce or effectively prevent recognition of light exiting from the display panel 50 from outside the display device 10.

Referring to FIG. 4, along a thickness direction, the third coupling member AM3 may have a first thickness t1, the shock-absorbing layer 70 may have a second thickness t2, the protection layer 90 may have a third thickness t3, and the cover window 80 may have a fourth thickness t4.

The fourth thickness t4 of the cover window 80 may range from about 30 micrometers (μm) to about 50 μm. That is, the fourth thickness t4 of the cover window 80 ranges from about 30 μm to about 50 μm such that a stress may decrease while the cover window 80 is folded and a structural deformation degree may be significantly reduced even when folding and unfolding are repeated.

The third thickness t3 of the protection layer 90 may be about 45 μm.

The first thickness t1 of third coupling member AM3 may range from about 25 μm to about 50 μm.

The second thickness t2 of the shock-absorbing layer 70 may range from about 20 μm to about 50 μm. The shock-absorbing layer 70 may include an organic insulating material as described above. The shock-absorbing layer 70 may be provided or formed on the fourth coupling member AM4 using a lamination method. Since the shock-absorbing layer 70 may include the organic insulating material, a thickness of the shock-absorbing layer 70 in process may be about 20 μm.

Also, when the second thickness t2 of the shock-absorbing layer 70 is smaller than or equal to 50 μm, minimizing a repulsive force with respect to folding which is generated by the thickness of the shock-absorbing layer 70 when the display device 10 is folded, is possible. In addition, wrinkling of the display device 10 due to the thickness of the shock-absorbing layer 70 may be reduced or effectively prevented.

The shock-absorbing layer 70 may increase durability of the display device 10 with respect to an external impact thereto, as described above.

FIGS. 5 and 6 are tables showing reliability of a comparative example and embodiments of a display device.

FIGS. 5 and 6 show performance of a comparative example, a first embodiment, and a second embodiment in respective reliability items. In the comparative example, the shock-absorbing layer 70 and the fourth coupling member AM4 are omitted and the fifth coupling member AM5 is disposed directly on the upper functional member 60. In the first embodiment, the second thickness t2 of the shock-absorbing layer 70 may be about 40 μm, the first thickness t1 of the third coupling member AM3 is about 35 μm, and the third thickness t3 of the protection layer 90 is about 45 μm. In the second embodiment, the second thickness t2 of the shock-absorbing layer 70 is about 23 μm, the first thickness t1 of the third coupling member AM3 is about 25 μm, and the third thickness t3 of the protection layer 90 is about 28 μm.

In FIG. 5, a first reliability item is a room-temperature (low temperature) repulsive force in newton centimeters (N·cm), a second reliability item is a crack-occurring rate in percent (%) of the upper functional member 60, that is, the polarization layer, a third reliability item is a minimum pressure in megapascals (Mpa) at which a crack occurs in the cover window 80, and a fourth reliability item is a length (μm) of generated wrinkles. A low temperature of the first reliability item may be about −20 degrees Celsius (° C.).

In FIG. 6, a first reliability item indicates a minimum ball-falling height in centimeters (cm) at which the display device 10 is restorable when a ball is dropped, a second reliability item indicates a minimum pen falling height (cm) at which the display device 10 is restorable when a pen is dropped, and a third reliability item indicates a minimum artificial finger nail scratching pressure in gram-force (gf) which does not leave scratch marks when the display device 10 is scratched using an artificial finger nail.

Referring first to FIG. 5, with respect to the first reliability item, the comparative example may be about 7.7 (11.0), the first embodiment may be about 8.1 (12.9), and the second embodiment may be about 6.3 (9.5). With respect to the second reliability item, the comparative example may be about 1.26, the first embodiment may be about 1.34, and the second embodiment may be about 1.23. With respect to the third reliability item, the comparative example may be about 796, the first embodiment may be about 783, and the second embodiment may be about 782. With respect to the fourth reliability item, the comparative example may be about 19, the first embodiment may be about 7.5, and the second embodiment may be about 7.8.

In more detail, referring to FIG. 5, the comparative example, the first embodiment and the second embodiment show mostly similar performance with respect to the second reliability item and the third reliability item. With respect to the first reliability item, the room-temperature (low temperature) repulsive force (N·cm) of the first embodiment may be greater than the room-temperature (low temperature) repulsive force (N·cm) of the comparative example. That is, folding of the display device 10 at room temperature (low temperature) in the first embodiment may be more difficult in comparison to folding of the comparative example. However, in the second embodiment where the second thickness t2 of the shock-absorbing layer 70 decreases to about 23 µm, the first thickness t1 of the third coupling member AM3 and the third thickness t3 of the protection layer 90 decrease to about 25 µm and 28 µm, respectively, the room-temperature (low temperature) repulsive force (N·cm) may be lower than that of the comparative example. In a view of the fourth reliability item, it may be seen that the lengths (µm) of generated wrinkles in the first embodiment and the second embodiment may be lower than that of the comparative example.

Referring to FIG. 6, with respect to the first reliability item, the comparative example may be about 5, the first embodiment may be about 8, and the second embodiment may be about 6. With respect to the second reliability item, the comparative example be have about 3, the first embodiment may be about 8, and the second embodiment may be about 5. With respect to the third reliability item, the comparative example may be about 1000, the first embodiment may be about 1900, and the second embodiment may be about 1800.

In more detail, referring to FIG. 6, the first embodiment and the second embodiment each have better performance with respect to the first to third reliability items than the comparative example.

Figure 7:
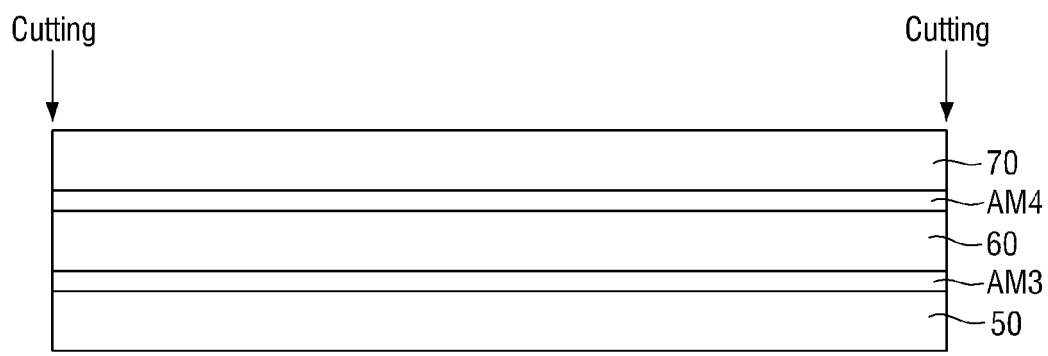
FIG. 7 is a cross-sectional view illustrating an embodiment of a process in providing the display device.

FIG. 7 is a cross-sectional view illustrating an embodiment of a process in providing the display device 10.

Referring to FIG. 7, in the display device 10, the display panel 50 or an object panel, the third coupling member AM3, the upper functional member 60, the fourth coupling member AM4, and the shock-absorbing layer 70 are disposed in order, such as being laminated.

The above-described structures may be sequentially laminated to form a stacked structure 50, AM3, 60, AM4, and 70, and side surfaces of the stacked structure 50, AM3, 60, AM4, and 70 may be punched or cut together ('Tutting' in FIG. 7). By being processed together, side surfaces of layers within the stacked structure 50, AM3, 60, AM4, and 70 may be aligned with each other (e.g., coplanar) along a thickness direction such as the third direction DR3 (refer to FIG. 1 and FIG. 3).

Also, although not shown in a plan view, planar sizes of the layers within the stacked structure 50, AM3, 60, AM4, and 70 may be equal to each other, such as along the first direction DR1 and/or the second direction DR2.

Since side surfaces of the shock-absorbing layer 70 are aligned with the side surfaces of the upper functional member 60 and since the shock-absorbing layer 70 has a same planar size as the upper functional member 60, a defect in reliability of the upper functional member 60 (e.g., a polarization layer) from cracks and the like generated from exposing and/or folding the upper functional member 60, may be reduced or effectively prevented.

In the following descriptions, components similar to or equal to those of the above-described embodiments will be referred to with the same reference numerals and a description thereon will be omitted or simplified.

Figure 8:
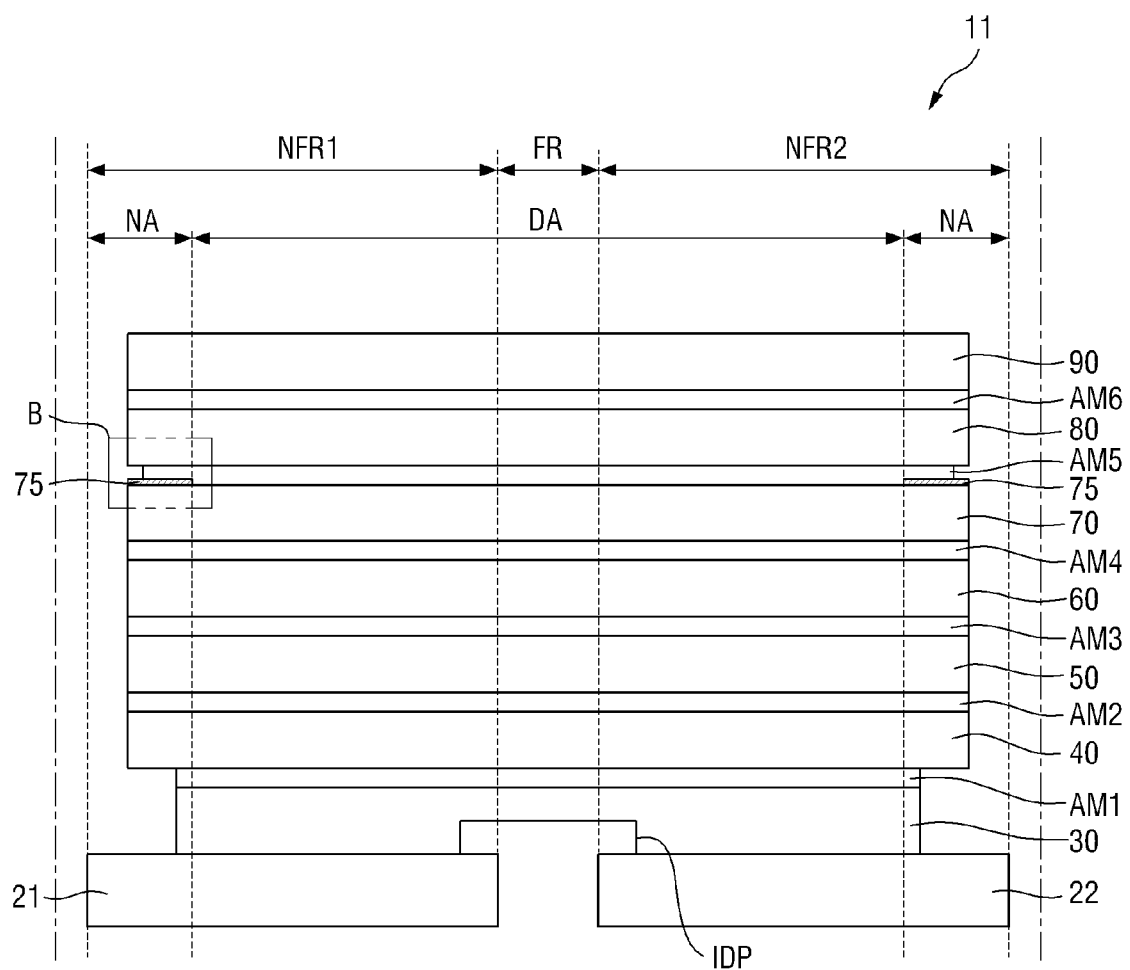
FIG. 8 is a cross-sectional view of another embodiment of a display device.
Figure 9:
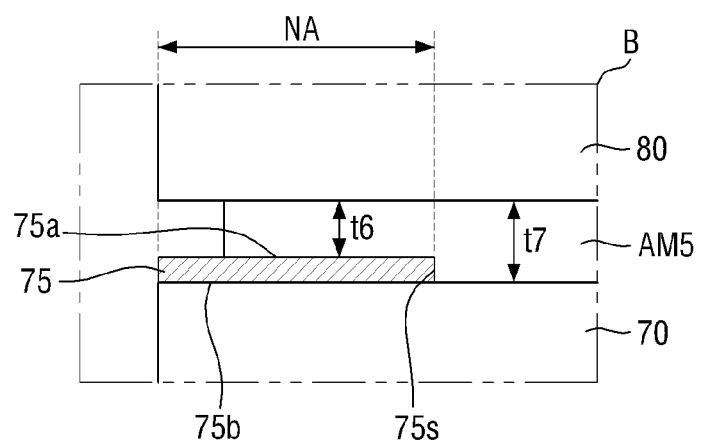
FIG. 9 is an enlarged cross-sectional view illustrating area B of FIG. 8.

FIG. 8 is a cross-sectional view of another embodiment of a display device 11, and FIG. 9 is an enlarged cross-sectional view illustrating area B of FIG. 8.

Referring to FIGS. 8 and 9, a display device 11 is different from the display device 10 of FIG. 3 in that the light-barrier pattern 75 is disposed between the shock-absorbing layer 70 and the fifth coupling member AM5.

In more detail, in the display device 11, the light-barrier pattern 75 may be disposed extended from a surface of the shock-absorbing layer 70. The light-barrier pattern 75 may be extended directly from the surface of the shock-absorbing layer 70 which faces the cover window 80.

A bottom surface 75b of the light-barrier pattern 75 may be in contact with the surface of the shock-absorbing layer 70. A first side surface 75s of the light-barrier pattern 75 and a top surface 75a of the light-barrier pattern 75 may be in contact with the fifth coupling member AM5. A second side surface of the light-barrier pattern 75 which is opposite to the first side surface 75s, may be aligned with the side surface of the shock-absorbing layer 70 along a thickness direction.

The fifth coupling member AM5 may be disposed to be overlapped with the light-barrier pattern 75 along a thickness direction. A portion of the fifth coupling member AM5 which is overlapped with the light-barrier pattern 75 may have a sixth thickness t6, and a portion of the fifth coupling member AM5 which is not overlapped with the light-barrier pattern 75 may have a seventh thickness t7. The sixth thickness t6 may be smaller than the seventh thickness t7. In other words, the seventh thickness t7 may be greater than the sixth thickness t6.

Figure 10:
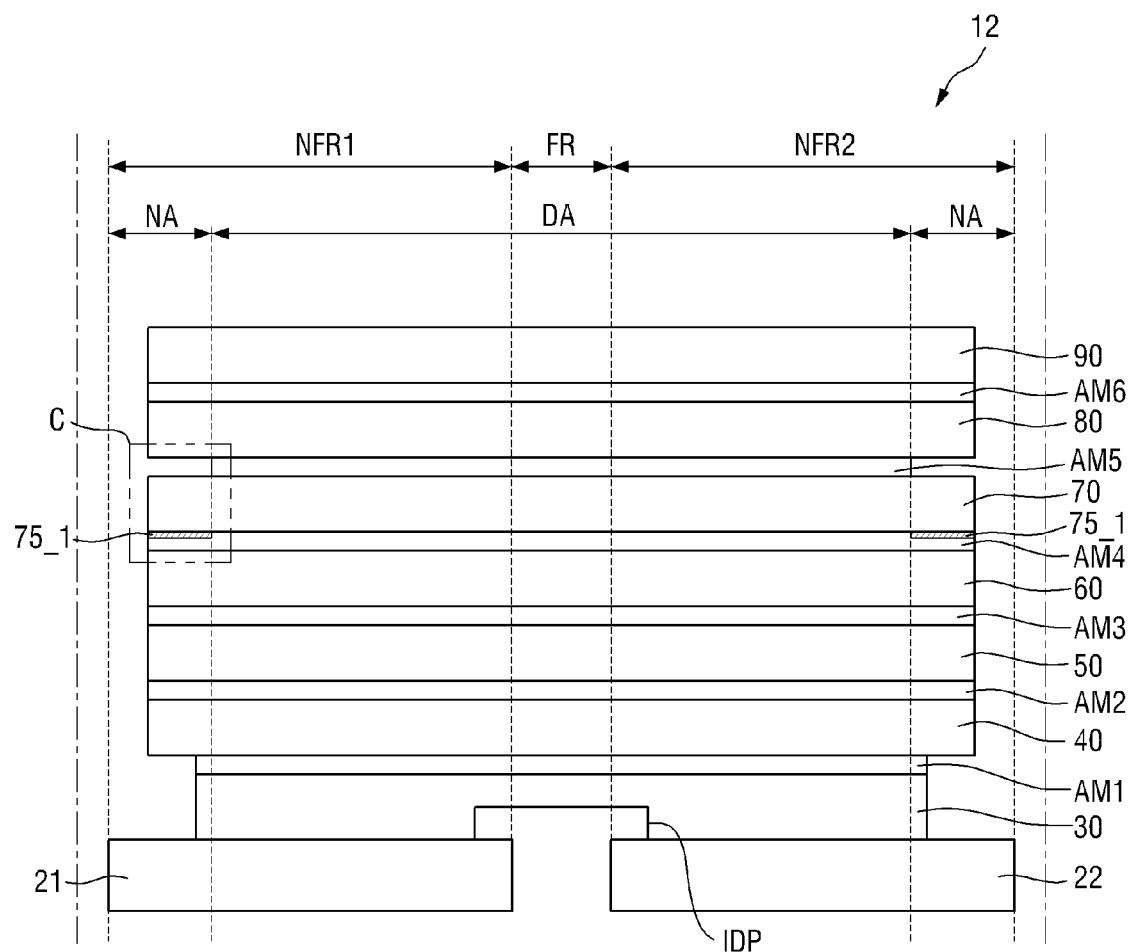
FIG. 10 is a cross-sectional view of another embodiment of a display device.
Figure 11:
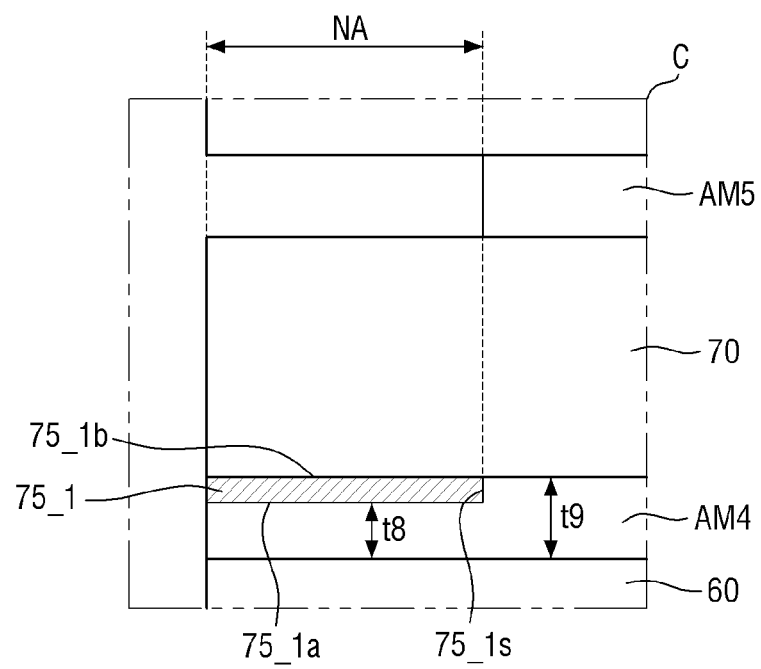
FIG. 11 is an enlarged cross-sectional view illustrating area C of FIG. 10.

FIG. 10 is a cross-sectional view of another embodiment of a display device 12, and FIG. 11 is an enlarged cross-sectional view of area C of FIG. 10.

Referring to FIGS. 10 and 11, a display device 12 is different from the display device 11 of FIGS. 8 and 9 in that a light-barrier pattern 75_1 is disposed between the shock-absorbing layer 70 and the fourth coupling member AM4.

In more detail, in the display device 12, the light-barrier pattern 75_1 is not disposed extended from a first surface of the shock-absorbing layer 70 which faces the cover window 80, but is disposed extended from a surface of the shock-absorbing layer 70 which faces the upper functional member 60) and is opposite to the first surface.

A top surface 75_1b of the light-barrier pattern 75_1 may be in contact with the second surface of the shock-absorbing layer 70. A first side surface 75_1s of the light-barrier pattern 75_1 and a bottom surface 75_1a of the light-barrier pattern 75_1 may be in contact with the fourth coupling member AM4. A second side surface of the light-barrier pattern 75_1 which is opposite to the first side surface 75_1s may be aligned with the side surface of the shock-absorbing layer 70 along a thickness direction.

The fourth coupling member AM4 may be disposed to be overlapped with the light-barrier pattern 75_1 along a thickness direction. A portion of the fourth coupling member AM4 which is overlapped with the light-barrier pattern 75_1 may have an eighth thickness t8, and a portion of the fourth coupling member AM4 which is not overlapped with the light-barrier pattern 75_1 may have a ninth thickness t9. The eighth thickness t8 may be smaller than the ninth thickness t9. In other words, the ninth thickness t9 may be greater than the eighth thickness t8.

Since the display device 12 is substantially the same as the embodiment of FIGS. 8 and 9 except for the light-barrier pattern 75_1, a repetitive description will be omitted below.

Figure 12:
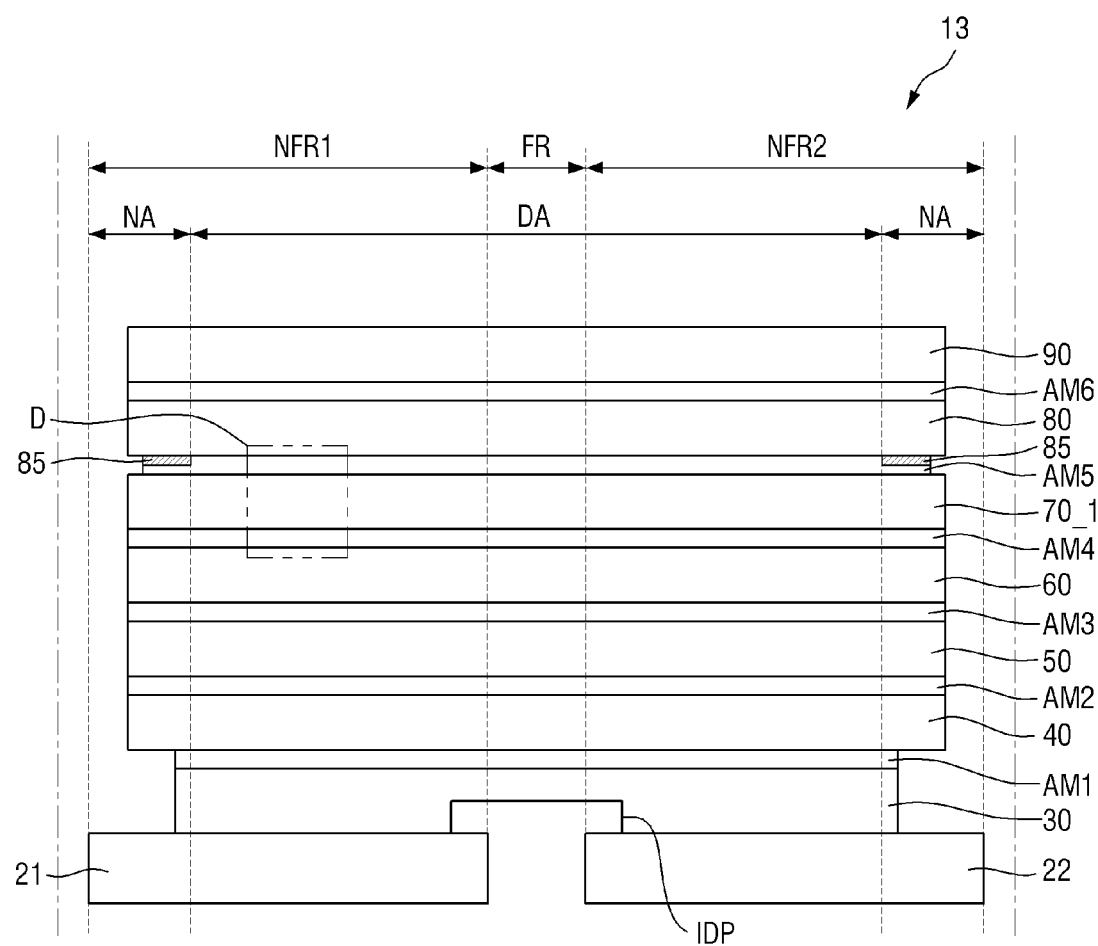
FIG. 12 is a cross-sectional view of another embodiment of a display device.
Figure 13:
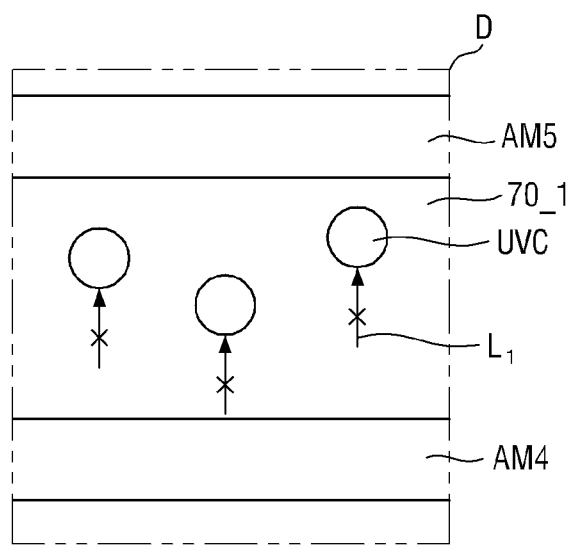
FIG. 13 is an enlarged cross-sectional view illustrating area D of FIG. 12.

FIG. 12 is a cross-sectional view of another embodiment of a display device 13, and FIG. 13 is an enlarged cross-sectional view of area D of FIG. 12.

Referring to FIGS. 12 and 13, a display device 13 is different from the display device 10 of FIG. 3 in that a light-barrier material UVC is further included in a shock-absorbing layer 70_1.

In more detail, the shock-absorbing layer 70_1 may further perform a short-wave light filtering function. A relatively short wave may include a wavelength range of about 10 nm to about 400 nm. That is, the shock-absorbing layer 70_1 further includes the light-barrier material UVC so as to reduce or effectively prevent transmission of short-wave light L1 among light provided from the display panel 50, to outside the shock-absorbing layer 70_1. The light-barrier material UVC may absorb the short-wave light L1.

Figure 14:
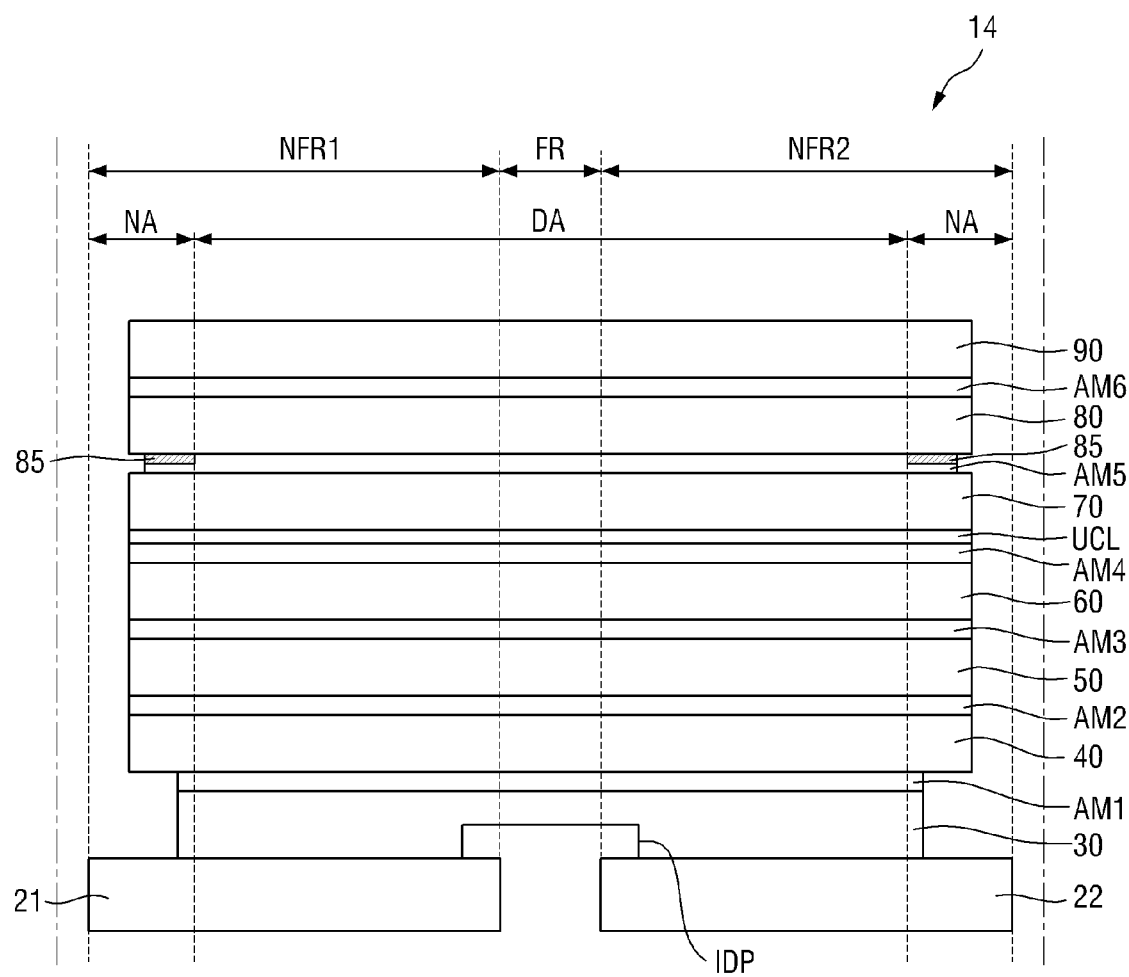
FIG. 14 is a cross-sectional view of another embodiment of a display device.

FIG. 14 is a cross-sectional view of another embodiment of a display device 14.

Referring to FIG. 14, a display device 14 is different from the display device 10 of FIG. 3 in that a light-barrier layer UCL may be further disposed.

In more detail, the light-barrier layer UCL of the display device 14 may be disposed between the shock-absorbing layer 70 and the fourth coupling member AM4. The light-barrier layer UCL may include the light-barrier material UVC described above with reference to FIGS. 12 and 13. Since the light-barrier material UVC has been described above in detail with reference to FIGS. 12 and 13, a repetitive description thereof will be omitted.

Figure 15:
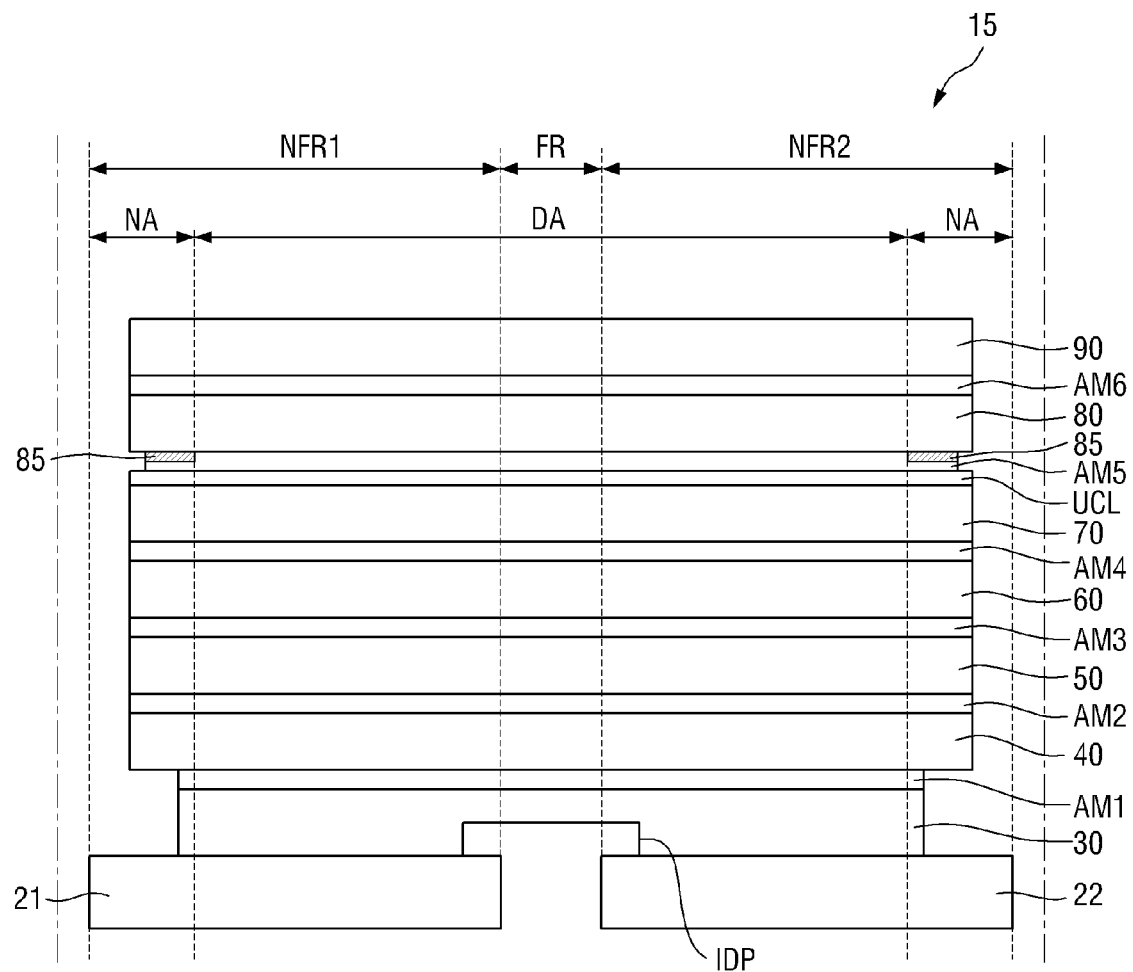
FIG. 15 is a cross-sectional view of another embodiment of a display device.

FIG. 15 is a cross-sectional view of another embodiment of a display device 15.

Referring to FIG. 15, a display device 15 is different from the embodiment of FIG. 14 in that the light-barrier layer UCL is disposed between the shock-absorbing layer 70 and the fifth coupling member AM5.

Since other features have been described above with reference to FIGS. 12 to 14, a repetitive description will be omitted.

According to one or more of the embodiments of the present disclosure, there is provided a display device with improved strength against an external impact.

Effects according to the embodiments are not restricted by the above exemplified content, and a variety of effects are included in the specification.

Although the embodiments of the invention have been described with reference to the attached drawings, one of ordinary skill in the art would understand that the invention may be implemented in other detailed forms without changing the scope or essential features thereof. Therefore, the above-described embodiments should be understood to be exemplary and not limiting.

What is claimed is:

1. A display device comprising:
    a display panel;
    a cover window facing the display panel;
    a functional layer between the display panel and the cover window;
    a shock-absorbing layer between the cover window and the functional layer;
    a first coupling interlayer which is between the shock-absorbing layer and the functional layer and couples the shock-absorbing layer and the functional layer to each other; and
    a second coupling interlayer which is between the shock-absorbing layer and the cover window and couples the shock-absorbing layer and the cover window to each other,
    wherein a thickness of the first coupling interlayer and the second coupling interlayer ranges from about 20 micrometers to 50 about micrometers.

2. The display device of claim 1, wherein the shock-absorbing layer comprises a transparent material.

3. The display device of claim 2, wherein the shock-absorbing layer comprises a transparent organic insulating material.

4. The display device of claim 3, wherein the organic insulating material comprises polyimide or polyethylene terephthalate.

5. The display device of claim 1, wherein the functional layer comprises a polarization layer.

6. The display device of claim 5, wherein a side surface of the shock-absorbing layer and a side surface of the functional layer are aligned with each other along a thickness direction.

7. The display device of claim 1, wherein a thickness of the cover window ranges from about 30 micrometers to about 50 micrometers.

8. The display device of claim 1, further comprising:
    a display area comprising a pixel,
    a non-display area adjacent to the display area, and
    a light-barrier pattern in the non-display area,
    wherein the light-barrier pattern is between the shock-absorbing layer and the second coupling interlayer.

9. The display device of claim 8, wherein
    the second coupling interlayer includes a first portion overlapping the light-barrier pattern and a second portion adjacent to the first portion, and
    a thickness of the first portion is smaller than a thickness of the second portion.

10. The display device of claim 1, further comprising:
    a display area comprising a pixel,
    a non-display area adjacent to the display area, and
    a light-barrier pattern in the non-display area,
    wherein the light-barrier pattern is between the shock-absorbing layer and the first coupling interlayer.

11. The display device of claim 10, wherein
    the first coupling interlayer includes a first portion overlapping the light-barrier pattern and a second portion adjacent to the first portion, and
    a thickness of the first portion is smaller than a thickness of the second portion.

12. The display device of claim 1, further comprising:
    a buffering layer facing the display panel, and
    a support film between the buffering layer and the display panel.

13. The display device of claim 12, further comprising:
    a folding region at which the display device is foldable, and
    a non-folded region at opposing sides of the folding region,
    wherein
    the buffering layer is in the folding region and the non-folded region, and
    in the folding region, the buffering layer is indented along a thickness direction.

14. The display device of claim 13, further comprising a metal plate facing the support film with the buffering layer therebetween,
    wherein
    the non-folded region comprises a first non-folded region and a second non-folded region opposing each other with the folding region therebetween,
    the metal plate comprises a first metal plate corresponding to the first non-folded region and a second metal plate corresponding to the second non-folded region, and the first metal plate and the second metal plate are spaced apart from each other with the folding region therebetween.

15. The display device of claim 1, further comprising a light-barrier layer between the shock-absorbing layer and the first coupling interlayer,
   wherein the light-barrier layer blocks light in an ultraviolet wavelength range.

16. The display device of claim 1, further comprising a light-barrier layer between the shock-absorbing layer and the second coupling interlayer,
   wherein the light-barrier layer blocks light in an ultraviolet wavelength range.

17. The display device of claim 1, wherein
   the shock-absorbing layer further comprises a light-barrier material, and
   the light-barrier material blocks light in an ultraviolet wavelength range.

18. A display device comprising:
   a display area comprising a pixel;
   a non-display area adjacent to the display area;
   a display panel;
   a cover window facing the display panel;
   a functional layer between the display panel and the cover window;
   a shock-absorbing layer between the cover window and the functional layer;
   a first coupling interlayer which is between the shock-absorbing layer and the functional layer and couples the shock-absorbing layer and the functional layer to each other;
   a second coupling interlayer which is between the shock-absorbing layer and the cover window and couples the shock-absorbing layer and the cover window to each other; and
   a light-barrier pattern in the non-display area, the light-barrier pattern extended from a surface of the shock-absorbing layer.

19. The display device of claim 18, wherein the surface of the shock-absorbing layer faces the functional layer.

20. The display device of claim 18, wherein the surface of the shock-absorbing layer faces the cover window.

* * * * *